(12) United States Patent
Friend

(10) Patent No.: US 6,580,212 B2
(45) Date of Patent: *Jun. 17, 2003

(54) DISPLAY DEVICE WITH IMPROVED CONTRAST

(75) Inventor: Richard Henry Friend, Cambridge (GB)

(73) Assignee: Cambridge Display Technology Ltd. (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/486,680

(22) PCT Filed: Sep. 1, 1998

(86) PCT No.: PCT/GB98/02615
§ 371 (c)(1),
(2), (4) Date: May 31, 2000

(87) PCT Pub. No.: WO99/12398
PCT Pub. Date: Mar. 11, 1999

(65) Prior Publication Data
US 2002/0185967 A1 Dec. 12, 2002

(30) Foreign Application Priority Data
Sep. 1, 1997 (GB) ............................................. 9718516

(51) Int. Cl.[7] ........................ H05B 33/24; H01L 51/20; H01L 27/15
(52) U.S. Cl. ....................................... 313/504; 313/113
(58) Field of Search ................................. 313/463, 466, 313/500, 504, 506, 17, 112, 478, 113, 499; 257/10, 11, 102, 103

(56) References Cited

U.S. PATENT DOCUMENTS

| | | | |
|---|---|---|---|
| 4,539,507 A | 9/1985 | VanSlyke et al. | 313/504 |
| 5,491,378 A | 2/1996 | Lee et al. | 313/506 |
| 6,091,195 A * | 7/2000 | Forrest et al. | 313/504 |
| 2001/0001050 A1 * | 5/2001 | Miyashita et al. | 428/690 |

FOREIGN PATENT DOCUMENTS

| | | |
|---|---|---|
| EP | 0880303 A1 | 11/1998 |
| JP | 01187838 | 7/1989 |
| JP | 08167477 | 6/1996 |
| WO | WO 90/13148 | 11/1990 |
| WO | WO 98/24271 | 6/1998 |

OTHER PUBLICATIONS

Denton et al., "Spectral Narrowing In Optically Pumped Poly(P–Phenylenevinylene) Films," Advanced Materials, vol. 9, No. 7, 1997, pp. 547–551.

Diaz–Garcia et al., " "Plastic" Lasers: Comparison of Gain Narrowing With A Soluble Semiconducting Polymer In Waveguides And Microcavities," Appl. Phys. Lett., vol. 70, No. 24, Jun. 16, 1997, pp. 3191–3193.

Berggren et al., "Light Amplification In Organic Thin Films Using Cascade Energy Transfer," Nature, vol. 389, Oct. 2, 1997, pp. 466–469.

Greenham et al., "Angular Dependence of the Emission From A Conjugated Polymer Light–Emitting Diode: Implications For Efficiency Calculations," Advanced Materials, vol. 6, No. 6, 1994, pp. 491–494.

* cited by examiner

Primary Examiner—Ashok Patel
(74) Attorney, Agent, or Firm—Finnegan, Henderson, Farabow, Garrett & Dunner, LLP

(57) ABSTRACT

A display device comprising: a light-emissive structure including two regions of light emissive material for emitting light in a viewing direction, the regions being spaced apart in a direction perpendicular to the viewing direction the light-emissive structure being capable of guiding light emitted from one of the light-emissive regions towards the other emissive region; and a barrier structure located between the light-emissive regions for inhibiting the propagation of light guided from the said one of the light-emissive regions to the other light-emissive region.

9 Claims, 6 Drawing Sheets

(a)

(b)

(c)

DISPLAY DEVICE WITH IMPROVED CONTRAST

FIELD OF THE INVENTION

One specific class of display devices is those that use an organic material for light emission. Light-emissive organic materials are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene) ("PPV"), sandwiched between two electrodes. One of the electrodes (the cathode) injects negative charge carriers (electrons) and the other electrode (the anode) injects positive charge carriers (holes). The electrons and holes combine in the organic layer generating photons. in PCT/WO90/13148 the organic light-emissive material is a polymer. In U.S. Pat. No. 4,539,507 the organic light-emissive material is of the class known as small molecule materials, such as (8-hydroxyquinolino) aluminium ("Alq3"). In a practical device one of the electrodes is typically transparent, to allow the photons to escape the device.

BACKGROUND OF THE INVENTION

FIG. 1 shows the typical cross-sectional structure of an organic light-emissive device ("OLED"). The OLED is typically fabricated on a glass or plastic substrate 1 coated with a transparent first electrode 2 such as indium-tin-oxide ("ITO"). Such coated substrates are commercially available. This ITO-coated substrate is covered with at least a layer of a thin film of an electroluminescent organic material 3 and a final layer forming a second electrode 4, which is typically a metal or alloy. Other layers can be added to the device, for example to improve charge transport between the electrodes and the electroluminescent material.

There are several approaches available for the processing of conjugated polymers such as PPV. One approach uses a precursor polymer which is soluble and can therefore be easily coated by standard solution-based processing techniques. Examples of coating techniques include: spin coating, blade-coating, reverse roll coating, meniscus coating, contact/transfer coating, and ink-jet printing. The precursor is then converted in situ by suitable heat treatment to give the fully conjugated and insoluble polymer. Another approach uses directly soluble conjugated polymers which do not require a subsequent conversion stage. Depending on the specific application, one or other of the approaches might be preferred. The precursor polymer approach can be especially useful where subsequent processing might lead to damage of the polymer film if it were directly soluble—such processing may be, for instance, coating with further polymer layers (for example, transport layers or emitting layers of another colour), or patterning of the top electrode. Converted precursor films also have better thermal stability, which is of importance both during fabrication and for the storage and operation of devices at high temperatures. FIG. 2 illustrates one arrangement for depositing light-emissive polymers by ink-jetting, where a glass sheet 10 is coated with an electrode 11 and light-emissive material 12 can then be deposited by ink-jetting on to the electrode 11. A second electrode can then be deposited over the light-emissive material. (See, for example PCT/WO98/24271, the contents of which are incorporated herein by reference).

When light is produced in an electroluminescent display or other light emitting device it is emitted in all directions. In a device of the type described above some light is emitted forwards, in a viewing direction, through the transparent electrode to the viewer, whilst some is emitted backwards to the opaque metallic electrode where it is either reflected forwards to the viewer or absorbed. Another portion of the light, the portion that is emitted or scattered to more oblique angles, can be waveguided within the emissive layer or within other layers such as the transparent electrode or charge transport layers. The part of the waveguided light that is not absorbed can eventually reach the edge of the emissive pixel. This light is travelling in a direction roughly normal to the principal viewing direction and will not contribute to the brightness of the device as seen by the viewer (see N. C. Greenham et al., Advanced Materials 6 (1994) p491).

The optical structure of the device, and specifically the thicknesses and refractive indices of the component layers, plays an important role in determining how efficiently it is possible for emitted light to be contained within the plane of the device, and thus move away from the electrically-driven pixel. For example, it is possible for light to be 'trapped' in 'slab waveguide' modes which propagate within the plane of a device of the type shown in FIG. 1. A general condition for waveguiding in a region of material is that the region should have a higher refractive index than the materials on either side of it. The emissive organic semiconducting layers can themselves act as this higher refractive index region, in which waveguiding can occur, since these materials commonly show higher refractive indices than the optically transparent materials, such as inorganic glasses or organic polymers which are used as substrate, cladding or insulating layers. The occurrence of this type of waveguiding has been described in some detail in the context of optically-stimulated gain in structure made with such materials, as described for example in: "Spectral Narrowing in Optically-Pumped Poly(p-phenylenevinylene) films", G. J. Denton, N. Tessler, M. A. Stevens and R. H. Friend., Adv. Mater. 9, 547–551 (1997), "plastic lasers: comparison of gain narrowing with a soluble semiconducting polymer in waveguides and microcavities", M. A. Diaz Garcia, F. Hide, B. J. Schwartz, M. D. Mcgehee, M. R. Andersson and A. J. Heeger, Appl. Phys. Lett. 70, 3191–3193 (1997), and "Light amplification in organic thin films using cascade energy transfer", M. Berggren, A. Dodabalapur, R. E. Slusher and Z. Bao, Nature 389, 466–468 (1997).

One common type of display comprises an array of light-emissive regions that can be controlled as independent pixels to allow a desired pattern to be displayed. The array is normally planar, with the light-emissive regions and their associated electrodes and other circuitry formed on a substrate such as a glass sheet. In a device of this type the obliquely emitted light travels in a direction generally in the plane of the display. In a multi-pixel device the waveguided light can cause further problems by causing cross-talk between pixels and reducing the contrast between emitting and non-emitting pixels.

The present invention aims to at least partially address one or more of these problems.

SUMMARY OF THE INVENTION

According to one aspect of the present invention there is provided a display device comprising: a light-emissive structure including two regions or light-emissive material for emitting light in a viewing direction, the regions being spaced apart in a direction perpendicular to the viewing direction and the light-emissive structure being capable of guiding light emitted from one of the light-emissive regions towards the other emissive region; and a barrier structure located between the light emissive regions for inhibiting the propagation of light guided from the said one of the light-emissive regions to the other light-emissive region.

The barrier structure may be a light-absorbent barrier structure of a light-reflective barrier structure. The barrier structure is preferably capable of redirecting in a viewing direction light emitted from the said first light-emissive region towards the barrier structure. Such light could be emitted directly towards the barrier structure or could be waveguided to the barrier structure.

The barrier structure preferably comprises an electrode for injecting electrical charge into the first light-emissive region.

The barrier structure preferably comprises an electrically insulating formation (which may be light-transmissive) and a light-reflective layer. The light-reflective layer is preferably formed over an upper surface of the insulating formation, which surface is preferably shaped to support the light-reflective layer in a configuration in which it is capable of absorbing light that reaches it from the first light-emissive region or reflecting such light out of the device in a viewing direction. The light-reflective layer may be provided by an electrode of the device, preferably the cathode.

The electrically insulating formation suitably defines wells for receiving the light-emissive material during formation of the device. The light-emissive material may be deposited into these wells by ink-jet printing.

The light-emissive structure may comprise an electrode for injecting charge into the first light-emissive region, suitably the anode electrode. That electrode may be capable of guiding light emitted from one of the light-emissive regions towards the other emissive region.

According to a second aspect of the present invention there is provided a display device comprising: a light-emissive structure formed on a substrate and including a region of light-emissive material for emitting light in a viewing direction; and a light-reflective structure formed on the substrate alongside the light-emissive structure for redirecting in the viewing direction light propagating from the light-emissive region to the light-reflective structure.

Preferably the light-reflective structure comprises an electrode for injecting electrical charge into the light-emissive material, most preferably the cathode electrode.

The barrier structure preferably comprises an electrically insulating formation and a light-reflective layer as described above.

The light-emissive material is suitably an organic material and preferably a polymer material. The light-emissive material is preferably a semiconductive and/or conjugated polymer material. Alternatively the light-emissive material could be of other types, for example sublimed small molecule films.

One or more charge-transport layers may be provided between each light-emissive region and one or both of the electrodes.

Each light-emissive region suitably represents a pixel of the display.

In one preferred embodiment the barrier structure consists of or comprises a transparent or translucent dome-shaped or otherwise profiled region (suitably of electrically insulating material) located around the edges of the emissive region. This may be defined by the intersection of a metallic cathode and a transparent anode, which reflects, refracts, waveguides or otherwise directs the light emerging from the edge of the emissive pixel re-directing it towards the viewer. The dome-shaped or otherwise profiled region which re-directs the light is suitably located around the periphery of the emissive region in a position such that the light emerging from the edge of the emissive layer is deflected by means such as a mirror or waveguide or both towards the viewer. The emissive region is suitably not covered by this profiled structure, allowing the transparent electrode to be coated, in the window defined by the profiled structure, with one or more organic materials that form the emissive region. The profiled surface of the structure can be coated with a reflective conducting metallic mirror which may be the same layer as that used for a pixel cathode. The profiled structure once formed is preferably thermally stable and will preferably not deform or outgas on subsequent processing during fabrication or during storage or high temperature operation.

One preferred way for the barrier structure to inhibit the propagation of light from one of the light-emissive regions to the other is for said structure to act as a mirror, so that radiation is redirected, either to leave the device in the viewing direction, or else back towards the pixel from which it was emitted (from where it may be directed towards the viewer, by scattering or other processes). There are many methods known within the art for achieving such reflecting properties, and these include the use of metallic mirrors and also the use of dielectric structure in which the reflective properties are achieved by ensuring that propagating optical modes are forbidden (as for example is achieved with dielectric stack mirrors).

In another preferred embodiment the barrier structure consists of or comprises a portion of the emissive layer that extends slightly beyond the emissive region as defined by the overlap or intersection of the cathode and anode and has profiled and reflectively coated edges such that the light being waveguided within the emissive layer can be reflected, refracted, waveguided or otherwise directed into a direction towards the viewer. Thus, in this embodiment, rather than forming the light re-directing structure from a different material the organic electroluminescent material itself is profiled. This is potentially a simpler structure in design and may have advantages in that it may be easier and therefore cheaper to fabricate.

In another preferred embodiment a substrate which has one or more regions coated with a transparent conductor forming isolated pixel anodes is spin coated with a layer of photoresist which is formed into separate islands using standard photolithographic techniques. These separate islands are suitably located above the anodes in areas where the emissive regions will be formed and may have a square or rectangular footprint. The photoresist preferably extends laterally beyond the edges of these emissive regions and preferably has a profile with steep side walls. The substrate may then be heated to allow the photoresist islands to adopt a hemispherical or more generally a rounded profile due to surface tension. The photoresist islands may then be coated with a reflective material such as a metal to form mirrors which are conformant to the profile of the photoresist islands, and are preferably curved. The central portion of the rounded structure may then be removed, e.g. using standard photolithographic techniques. The reflective metallic layer may act as a mask and/or etch stop for the plasma etching of a central window in the photoresist. Thus a window, e.g. of square or rectangular shape, can be formed leaving a curved profiled border around the emissive region. The substrate can then be coated with an organic electroluminescent material and a cathode.

In another preferred embodiment the preferably square or rectangular islands can be formed with their central portion already removed at the first photolithographic stage. This creates a hollow frame-like structure around the emissive region with steep side walls on its inside and outside. After the heating stage the frame-like structure becomes more rounded and forms a bead around the edge of the emissive area with a hemispherical or more generally rounded cross-section profile. This can then be coated with an organic electroluminescent material followed by a reflective metallic coating which can also act as the cathode.

In another preferred embodiment the emissive layer is an organic electroluminescent polymer which is coated directly onto the patterned transparent conductor coated substrate and converted if necessary. Separate square or rectangular islands of photoresist with steep side walls can be formed using standard photolithographic methods. The entire substrate may then be subjected to plasma etching to remove both the polymer and the photoresist to some extent. This suitably results in the polymer layer having an angled side wall profile. A reflective coating which also acts as the cathode can also be deposited on the substrate.

In another preferred embodiment a substrate coated with a patterned transparent conductor is then coated with an insulating material such as an insulating polymer (such as polyimide) which can be patterned and processed using standard photolithography and is thus preferably insoluble in solvents that dissolve photoresist. The substrate can then be coated with photoresist and patterned as in the second embodiment to create a hollow frame-like structure to lie around the emissive region, with steep side walls on the inside and outside. Plasma etching can then remove both the photoresist and the underlying polymer in such a manner as to produce a hollow frame-like structure in the underlying polymer with angled side walls. This structure can then be coated with an organic electroluminescent material and a reflective metallic coating which also acts as the cathode.

Some preferred materials for components (where present) of the display device are as follows:

One of the electrodes (the hole-injecting electrode) preferably has a work function of greater than 4.3 eV. That layer may comprise a metallic oxide such as indium-tin oxide ("ITO") or tin oxide ("TO") or a high work function metal such as Au or Pt. The other electrode (the electron-injecting electrode) preferably has a work function less than 3.5 eV. That layer may suitably be made of a metal with a low work function (Ca, Ba, Yb, Sm, Li etc.) or an alloy or multi-layer structure comprising one or more of such metals together optionally with other metals (e.g. Al). At least one of the electrode layers is suitably light transmissive, and preferably transparent, suitably at the frequency of light emission from one or more of the light-emissive regions.

The or each charge transport layer may suitably comprise one or more polymers such as polystyrene sulphonic acid doped polyethylene dioxythiophene ("PEDOT-PSS"), poly(2,7-(9,9-di-n-octylfluorene)-(1,4-phenylene-(4-imino(benzoic acid))-1,4-phenylene-(4-imino(benzoic acid))-1,4-phenylene)) ("BFA"), polyaniline and PPV.

The or each organic light-emissive material may comprise one or more individual organic materials, suitably polymers, preferably fully or partially conjugated polymers. Suitable materials include one or more of the following in any combination: poly(p-phenylenevinylene) ("PPV"), poly(2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene) ("TFB"), poly(2,7-(9,9-di-n-octylfluorene)-(1,4-phenylene-((4-methylphenyl)imino)-1,4-phenylene-((4-methylphenyl)imino)-1,4-phenylene)) ("PFM"), poly(2,7-(9,9-di-n-octylfluorene)-(1,4-phenylene-((4-methoxyphenyl)imino)-1,4-phenylene)) ("PFMO"), poly (2,7-(9,9-di-n-octylfluorene) ("F8") or (2,7-(9,9-di-n-octylfluorene)-3,6-Benzothiadiazole) ("F8BT"). Alternative materials include small molecule materials such as Alq3.

According to a third aspect of the present invention there is provided a method for forming a display device of any of the types described above.

According to a fourth aspect of the present invention there is provided electronic apparatus (such as a computer display or a portable computer) comprising a display device of any of the types described above.

Any implied orientation of the device is not necessarily related to its orientation during use or manufacture.

BRIEF DESCRIPTION OF THE DRAWINGS

The present invention will now be described by way of example with reference to the accompanying drawings, in which.

The figures are not to scale.

DETAILED DESCRIPTION

Figure 1:
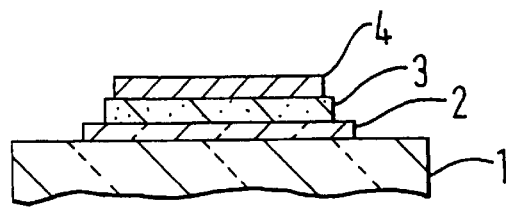
Figure 2:
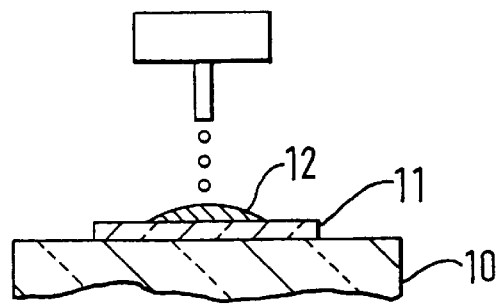
Figure 4:
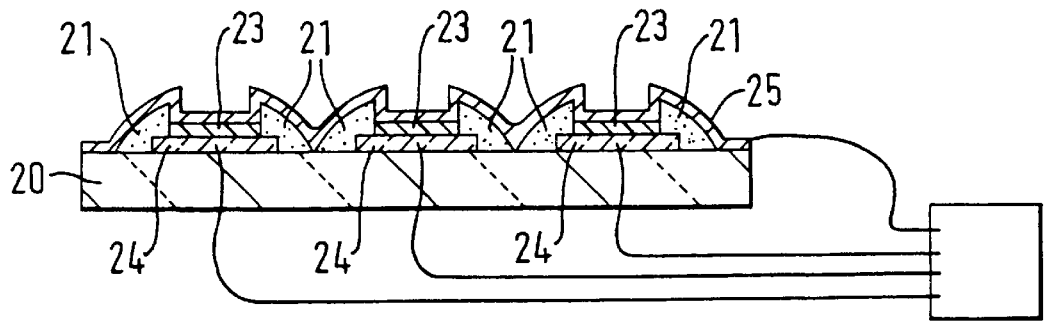
FIG. 4 shows a cross-section of a second device.
Figure 3:
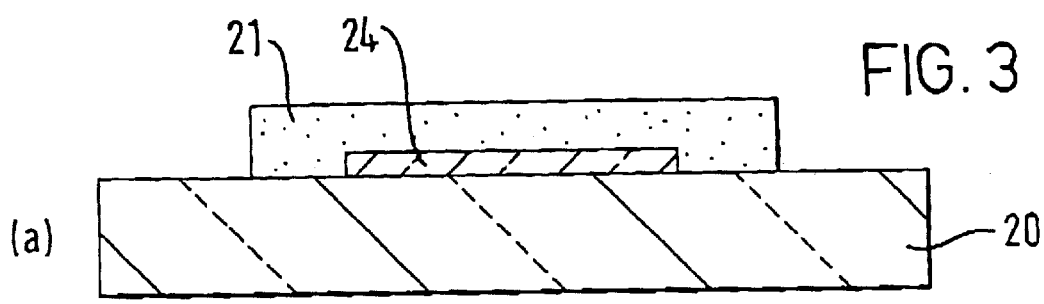
FIG. 3 shows cross-sections illustrating successive stages in the formation of a first device.
Figure 3:
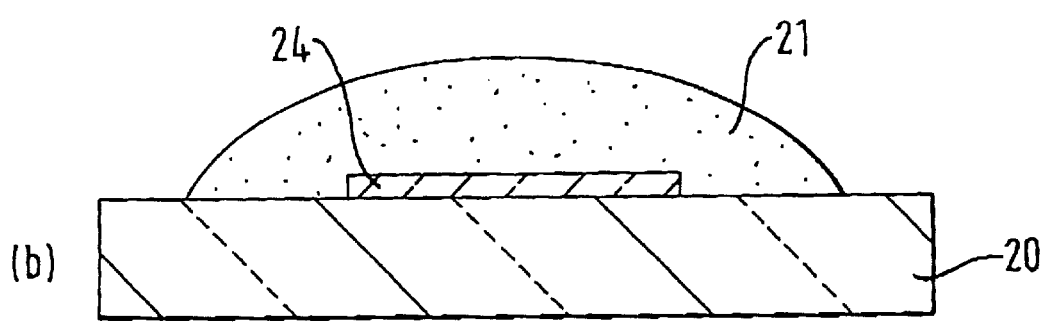
Figure 3:
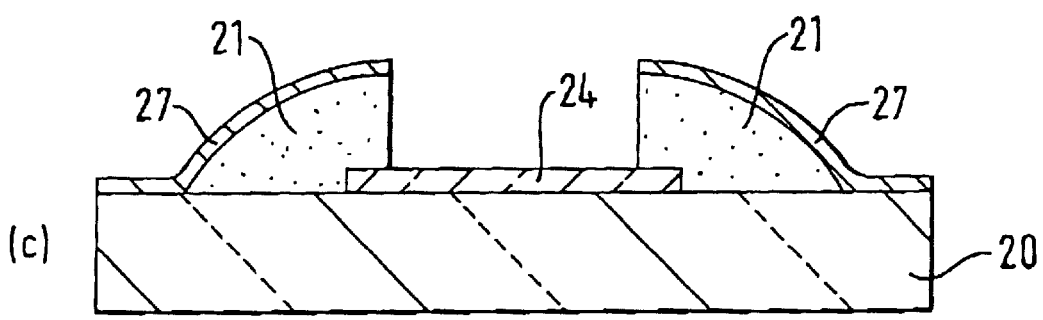
Figure 3:
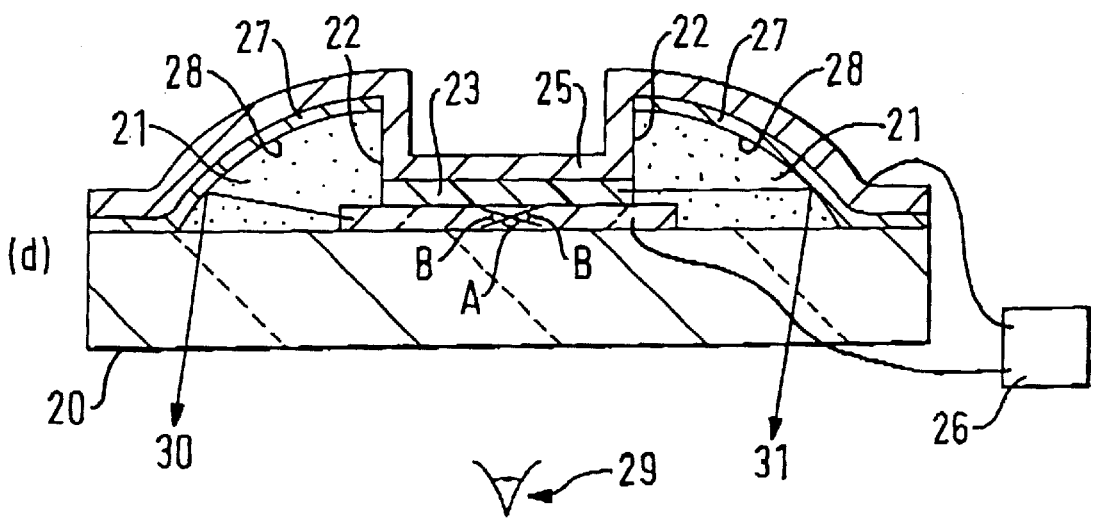

The substantially completed structure of the device of FIG. 3 is shown in FIG. 3(d). The device comprises a transparent substrate 20 on which there is an insulating region 21. The inner walls 22 of the insulating region define a well in which light-emissive region 23 can be deposited by ink-jetting. Electrodes 24, 25 are located on either side of the light-emissive region and are connected to driving circuitry 26 which allows a suitable voltage to be applied across the light-emissive region in order for it to emit light. A light-reflective layer 27 lies over the upper/side walls 28 of the insulating region 21, and its lower surface conforms to the shape of the upper/side walls. The shape of the lower surface of the light-reflective layer is such as to cause at least some light that is emitted into the device (rather than directly outwards towards a viewer 29) to be directed out of the device in a viewing direction. For example, the paths of some modes that are reflected in this way by the light-reflective layer are shown at 30 and 31. The effect of the light-reflective layer is thus to increase the proportion of the light that is emitted from the light-emissive region 23 that exits the device in viewing directions. This increases the effective power efficiency of the device. The device of FIG. 3 could be extended to comprises more than one light-emissive region, as shown in FIG. 4. In this device the light-reflective layer not only increases the effective power efficiency of the device, but can also inhibit cross-talk and increase contrast between the light-emissive regions. This latter effect could also be achieved if the light-reflective layer were replaced with a light-absorbent layer.

FIGS. 3(a) and 3(c) show successive stages in the formation of the structure shown in FIG. 3(d). The substrate 20 is a glass sheet, and is coated with transparent conductive indium-tin oxide (ITO) which forms the anode electrode 24. Such ITO-coated glass substrates are commercially available. The ITO is patterned to create the required form of the anode. A layer of positive photoresist 21 is then spin-coated over the ITO and the glass, and then patterned using standard photolithographic techniques of masking during exposure to ultra-violet radiation, development, baking, etc., to form an island of photoresist over the electrode 24. The photoresist covers the electrode and extends sideways a little beyond the edge of the electrode. The photoresist could, for example, be between a few and a few tens of microns thick. This results in the structure of FIG. 3(a).

The structure is then heated so as to melt or at least soften the photoresist and cause it to bead up under the action of surface tension (tending to reduce the surface area) to form the generally semicircular cross-sectional shape illustrated in FIG. 3(b). The footprint of the photoresist on the substrate (which could for example be round, square or rectangular) is maintained by the strong interaction between the photoresist ant the substrate material. This interaction could be increased if necessary by using an adhesion promoter, which could be spun on to the substrate immediately before the photoresist is applied.

A highly reflective material such as aluminium is then deposited over the photoresist and the adjacent area of the glass substrate to form the reflective layer 27. The aluminium may be deposited using DC magnetron sputtering to a depth of around 100 nm. A second layer of positive photoresist is deposited over the aluminium and using the same masking, exposure, development and baking etc. steps as before a window is formed in the photoresist at the location over the electrode 24 where the light-emissive material is to be deposited. This window extends through the full depth of the photoresist and is preferably slightly smaller in area, although the same shape, as the electrode 24. Then the aluminium 27 is under the window is removed using reactive ion etching in an atmosphere of silicon tetrachloride. This forms a window in the aluminium of the same shape as the one in the second photoresist layer. An anisotropic plasma etching step is then carried out in an oxygen atmosphere, which removes the second layer of photoresist and, under the window formed in the aluminium layer 27, the first layer of photoresist 21. The aluminium layer 27 acts as a mask for the etching of the photoresist 21. The photoresist 21 under the window in the aluminium 27 is removed to the depth of the electrode 24. This forms the structure illustrated in FIG. 3(c), where the well has a rectangular footprint out of the plane of the figure, steep side walls and is around 2 μm deep.

A layer of light-emissive polymer such as PPV is then ink-jet printed into the well to a final thickness of around 100 nm. This can be achieved by ink-jet depositing a PPV precursor polymer that is a random copolymer with acetate side-groups and tetrahydrothiophenium leaving groups with bromide counter ions in a water/methanol mixture. This structure is then baked at 150° C. for 4 hours in a high-purity nitrogen atmosphere to convert the PPV precursor into the electroluminescent copolymer film of thickness approximately 100 nm and to remove the solvents. The electroluminescent PPV copolymer layer 23 that is formed has conjugated PPV segments and non-conjugated α-acetyloxy, p-xylylene units. A cathode electrode 25 is then deposited over the light-emissive polymer layer 23 by DC magnetron sputtering. A suitable material for the sputtering target is 95% Al, 2.5% Lt, 1.5% Cu, 0.5% Mg. This produces the structure shown in FIG. 3(d).

Contacts are then attached to the electrodes and the device can be encapsulated, for example in an epoxy encapsulant, for environmental protection.

When the device is in use, light that is emitted in all but extreme lateral directions towards the glass substrate will pass directly out of the device. (This is illustrated for a point in the emissive region by range of angles A). Light that is emitted sideways (range of angles B) hits the light-reflective layer 27 and is reflected by that layer towards the glass substrate and thus passes indirectly out of the device.

The profiled structure is preferably sufficiently inert that it does not cause problems by, for example, outgassing once the device has been formed.

The device of FIG. 4 is formed in a similar way to that of FIG. 3. Like parts are numbered in FIG. 4 as in FIG. 3. The device of FIG. 4 may provide a two-dimensional orthogonal array of light-emissive regions. The anode electrodes 24 in the device of FIG. 4 may connect light-emissive regions in a single row of the array and the cathode electrodes 25 of FIG. 4 may connect light-emissive regions in a single column of the array. By this means the display driver can address the light-emissive regions using a passive matrix addressing scheme. Alternatively, the electrodes could be configured, and if necessary the display provided with extra circuitry (e.g. thin-film transistor (TFT)) circuitry, to allow the display driver to use an active matrix addressing scheme.

Figure 5:
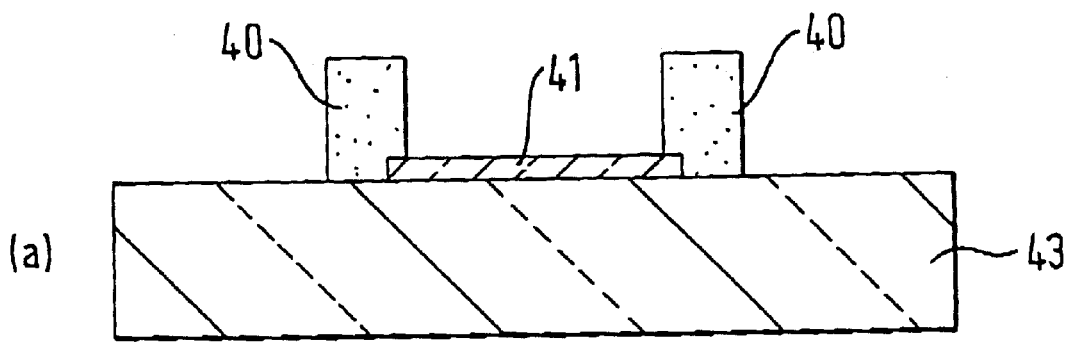
FIG. 5 shows cross-sections illustrating successive stages in the formation of a third device.
Figure 5:
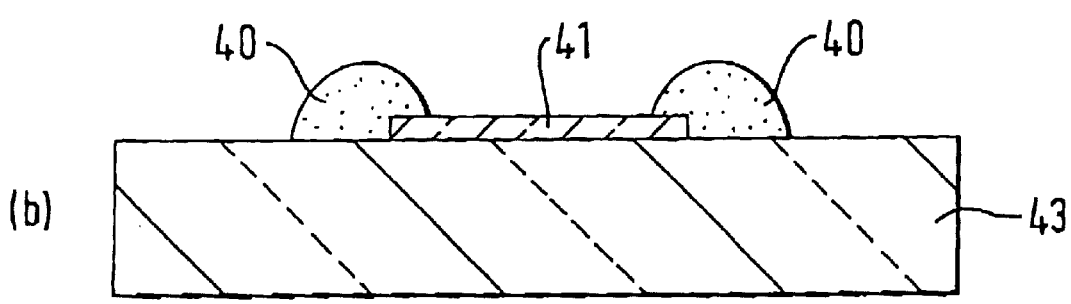
Figure 5:
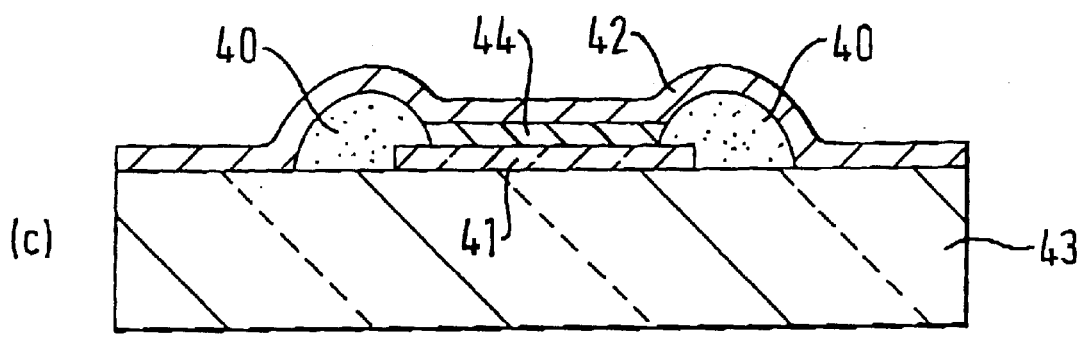

FIG. 5 illustrates an alternative device structure. In this structure the well for receiving the light-emissive material is defined by a wall 40 of photoresist that surrounds the region where light-emissive material 41 is to be deposited (FIG. 5(a)). This wall of photoresist is then heated to round its shape. (FIG. 5(b)). In this embodiment the cathode 42 itself is used as the light-reflective layer (FIG. 5(c)). In FIG. 5 the glass substrate is shown at 43 and the light-emissive layer at 44.

Figure 6:
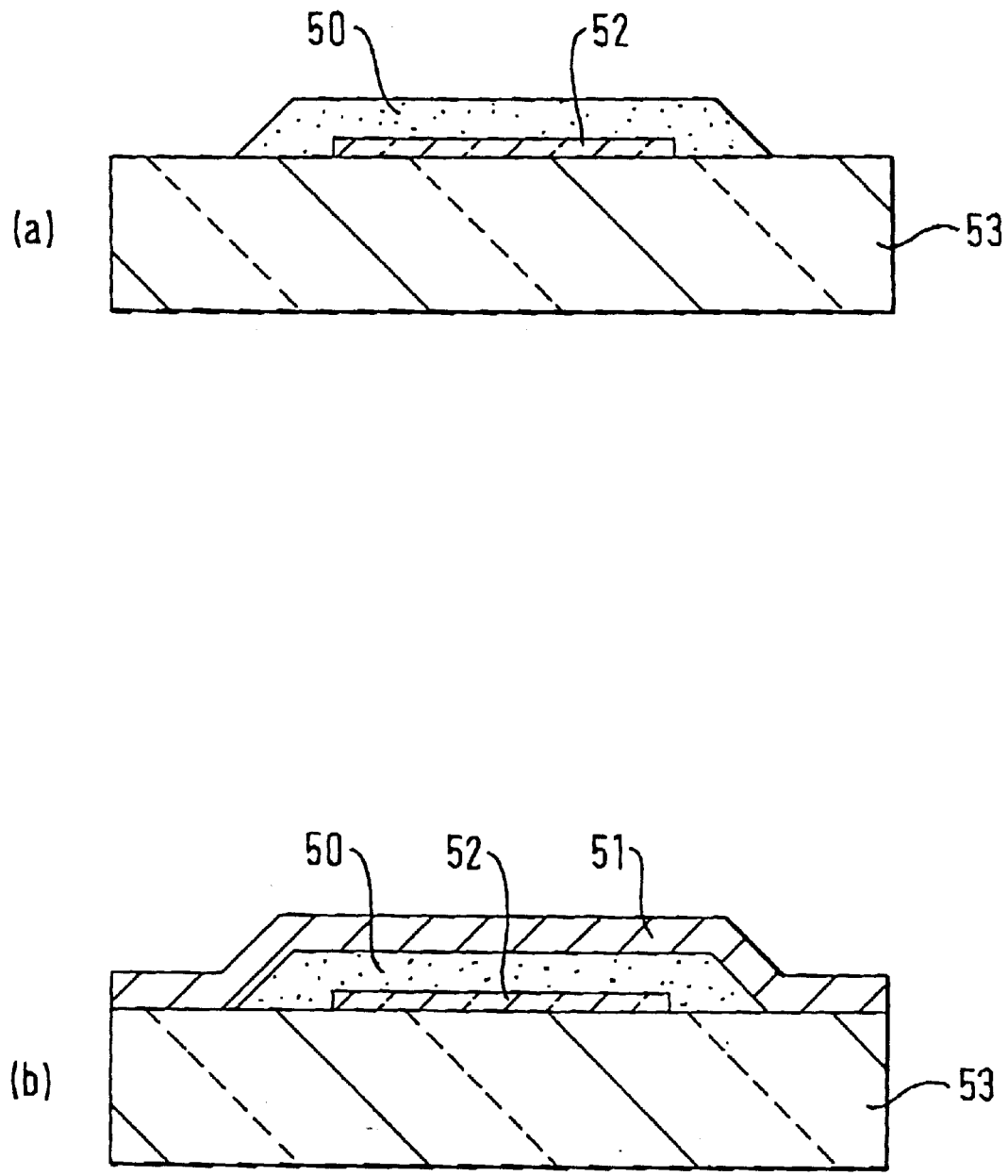
FIG. 6 shows cross-sections illustrating successive stages in the formation of a fourth device.

FIG. 6 illustrates another alternative structure in which the edge of the emissive material 50 itself is shaped so that the conformant cathode layer 51 of reflective material can overly the emissive material and act as a light-reflective layer. In this embodiment the light-emissive material overlaps the edge of the anode 52 so that there is not an electrical short between the electrodes. The glass substrate is shown at 53.

Figure 7:
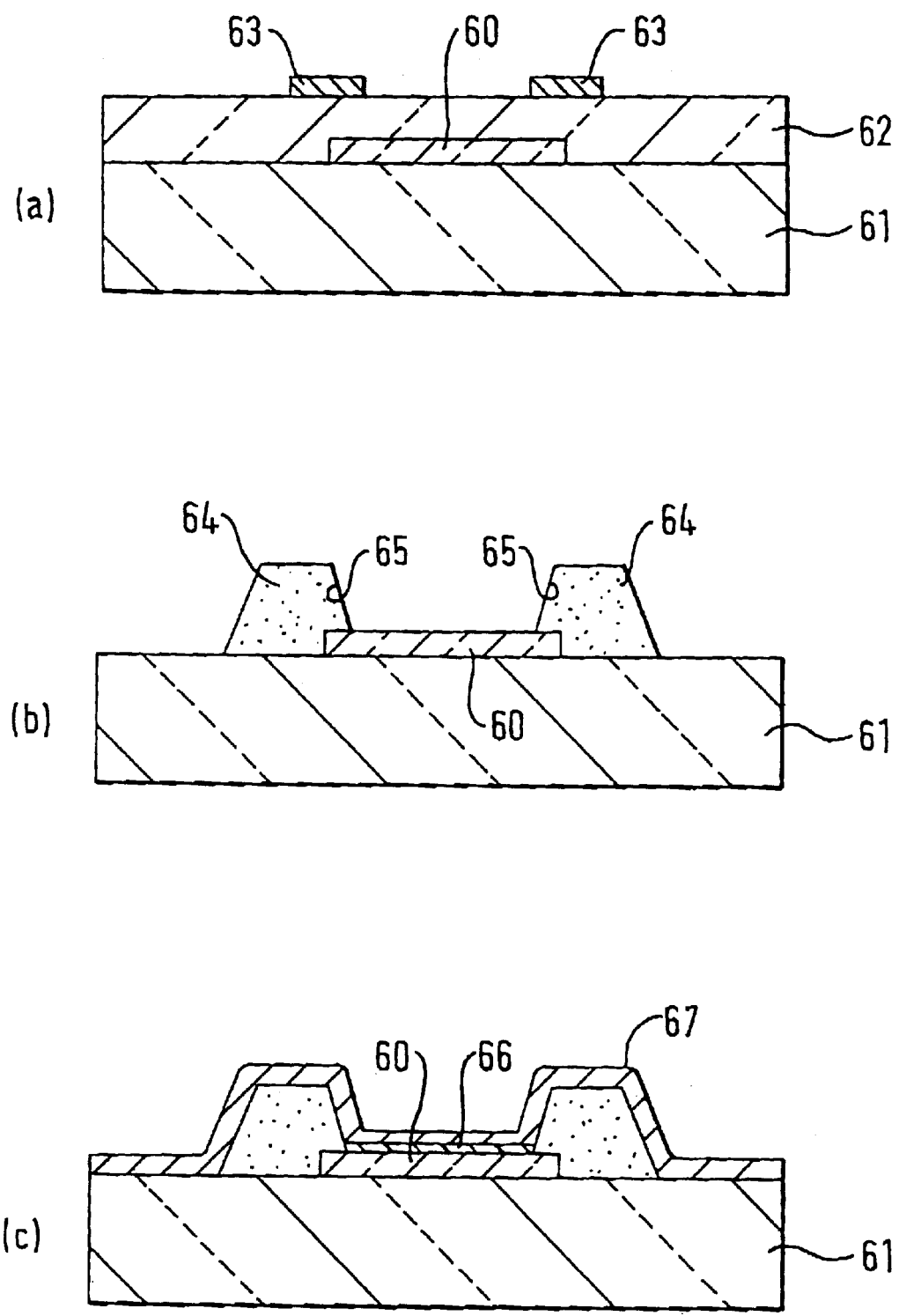
FIG. 7 shows cross-sections illustrating successive stages in the formation of a fifth device.

FIG. 7 illustrates another alternative structure. In this embodiment the anode layer 60 is formed on the glass substrate 61 as described above. Over the anode layer and the glass substrate an insulating layer 62 of polyimide is formed. Over the polyimide layer a layer of positive photoresist is deposited and this is patterned using the process described above to leave a region 63 of photoresist that covers the polyimide around the outer edge of the anode 60. (See FIG. 7(a)). Then the polyimide is removed in the regions where it is not protected by the photoresist to leave a bank 64 of polyimide whose inner walls 65 define the well that is to receive light-emissive material and which overlaps the edge of the anode 60. (See FIG. 7(b)). Then the light-emissive material 66 and the light-reflective cathode 67 are deposited as before. In this embodiment of the bank 64 also insulates the anode 60 from the cathode 67. The lower surface of the cathode conforms to the surface of the bank. The outer walls of the bank are angled so as to allow the reflective cathode to reflect sideways-emitted light out of the device.

Figure 8:
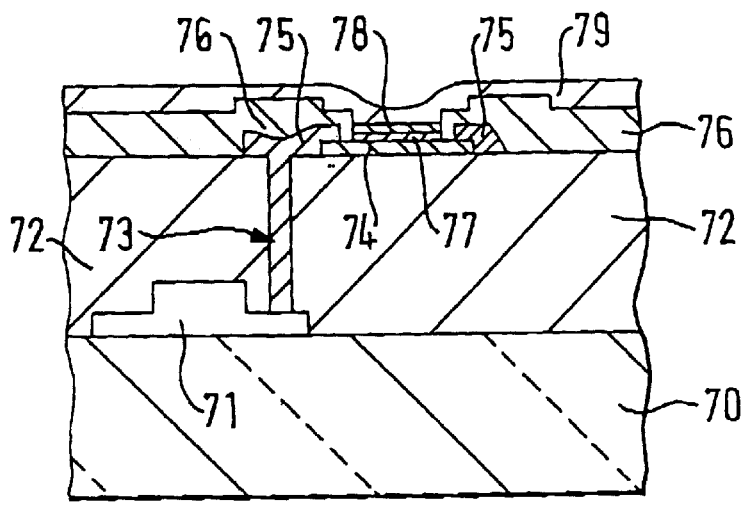
FIG. 8 is a partial cross-section of a fifth device.

FIG. 8 shows a cross-section of part of another structure. In this structure there is a glass substrate 70 on which is deposited TFT active matrix circuitry 71. Over the TFT circuitry an insulating layer 72 of SiO2 is deposited and a contact via 73 is made through it to meet the output of the TFT circuitry. On the top of the SiO2 an ITO anode layer 74 is formed. The aluminium 75 is deposited so as to overlap the edge of the ITO and also fill the via 73 so as to contact the ITO to the output of the TFT circuitry. Over the ITO and the aluminium are formed banks of SiO2 76 which define a well for containing a charge transport layer 77 (in this case of PEDOT:PSS) and over it a layer 78 of light-emissive material (in this case of a mixture of 5F8BT with TFB). Over that a cathode 79 is formed.

Figure 9:
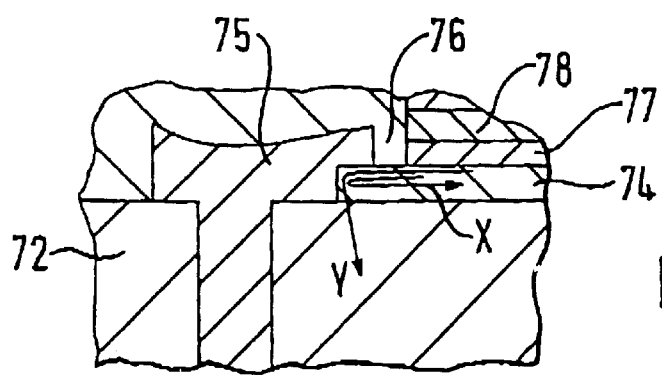
FIG. 9 is an enlarged view of part of FIG. 8.

The refractive index of the layers 78, 77, 74 and 72 are around 1.7, 1.4–1.65, 1.7–1.8 and 1.54 respectively. When light is emitted sideways in this device some is reflected off the aluminium 75 back into the emissive layer (see arrow X in FIG. 9, which shows an enlarged view of part of the device of FIG. 8) but some modes are believed to be deflected out of the device in viewing directions (see arrow Y in FIG. 9).

Figure 10:
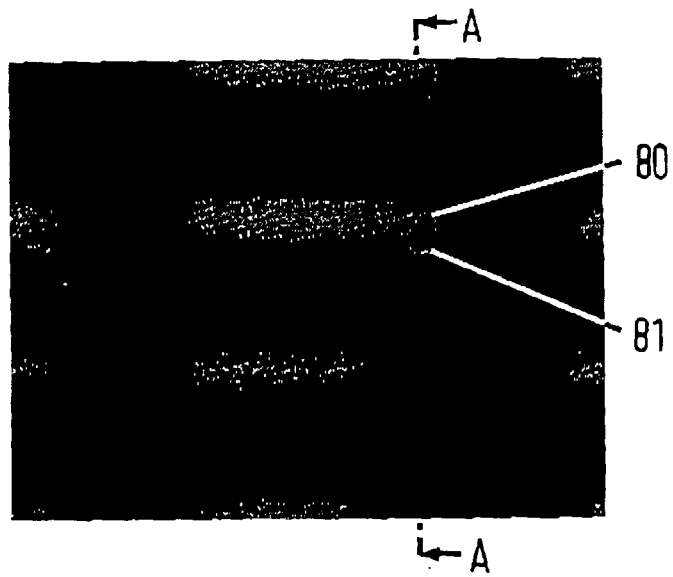
FIG. 10 is an enlarged photograph of part of the device of FIG. 7 from the principal viewing direction, normal to the plane of the device..

FIG. 10 shows the emission from an array of such devices. The direct emission from the light-emissive region is shown at 80 and the indirect emission after deflection believed to be by the aluminium 75 is shown at 81. The cross-section of FIG. 8 is on part of the line A—A in FIG. 10.

Individual devices of the types shown in FIGS. 5, 6 and 7 could, of course, be combined into multi-device structures. Additional layers such as charge transport layers could be used in any of the devices.

The principles described above could be applied to other types of organic or inorganic display devices. One specific alternative example is the class of display devices that use sublimed molecular films for light emission, as described for example in "Organic Electroluminescent Diodes", C. W. Tang and S. A. VanSlyke, Appl. Phys. Lett. 51, 913–915 (1987).

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

What is claimed is:

1. A display device comprising:
    a light-emissive structure including two regions of light-emissive material for emitting light in a viewing direction, the regions being spaced apart in a direction perpendicular to the viewing direction and the light-emissive structure being capable of guiding light emitted from one of the light-emissive regions towards the other light-emissive region; and
    a barrier structure located between the light-emissive regions for inhibiting the propagation of light guided from the said one of the light-emissive regions to the other light-emissive region, wherein the barrier structure is an electrode for injecting electrical charge into the said one of the light-emissive regions.

2. Electronic apparatus comprising a display device as claimed in claim 1.

3. A display device as claimed in claim 1, wherein the light-emissive material is an organic light-emissive material.

4. A display device as claimed in claim 1, wherein the light-emissive material is a semiconductive polymer material.

5. A display device as claimed in claim 1, wherein the light-emissive material is deposited by ink-jet printing.

6. A display device comprising:
    a light-emissive structure formed on a substrate and including a region of light-emissive material for emitting light in a viewing direction; and
    a light-reflective structure formed on the substrate alongside the light-emissive structure for redirecting in the viewing direction light propagating from the light-emissive region to the light-reflective structure, wherein the light-reflective structure is an electrode for injecting electrical charge into the light-emissive material.

7. A display device as claimed in claim 6, wherein the light-emissive material is an organic light-emissive material.

8. A display device as claimed in claim 6, wherein the light-emissive material is a semiconductive polymer material.

9. A display device as claimed in claim 6, wherein the light-emissive material is deposited by ink-jet printing.

* * * * *

UNITED STATES PATENT AND TRADEMARK OFFICE
CERTIFICATE OF CORRECTION

PATENT NO. : 6,580,212 B2
DATED : June 17, 2003
INVENTOR(S) : Richard Henry Friend It is certified that error appears in the above-identified patent and that said Letters Patent is hereby corrected as shown below:

<u>Title page,</u>
Item [57], ABSTRACT,
Line 2, "light emissive" should read -- light-emissive --.
Line 4, after "the viewing direction", insert -- and --.

Signed and Sealed this

Fourteenth Day of October, 2003

JAMES E. ROGAN
*Director of the United States Patent and Trademark Office*